(12) United States Patent
Gupta

(10) Patent No.: US 12,537,516 B2
(45) Date of Patent: Jan. 27, 2026

(54) SINGLE PIN CLOCK-FREE RETENTION FLIP-FLOP

(71) Applicant: STMicroelectronics International N.V., Geneva (CH)

(72) Inventor: Rohit Kumar Gupta, Noida (IN)

(73) Assignee: STMicroelectronics International N.V., Geneva (CH)

(*) Notice: Subject to any disclaimer, the term of this patent is extended or adjusted under 35 U.S.C. 154(b) by 91 days.

(21) Appl. No.: 18/666,532

(22) Filed: May 16, 2024

(65) Prior Publication Data

US 2024/0396535 A1 Nov. 28, 2024

Related U.S. Application Data

(60) Provisional application No. 63/504,544, filed on May 26, 2023.

(51) Int. Cl.
*H03K 3/012* (2006.01)
*H03K 3/037* (2006.01)
*H03K 3/356* (2006.01)

(52) U.S. Cl.
CPC .......... *H03K 3/0375* (2013.01); *H03K 3/012* (2013.01); *H03K 3/356008* (2013.01)

(58) Field of Classification Search
CPC . H03K 3/012; H03K 3/0375; H03K 3/356008
See application file for complete search history.

(56) References Cited

U.S. PATENT DOCUMENTS

| | | | |
|---|---|---|---|
| 6,437,623 B1 | 8/2002 | Hsu et al. | |
| 8,421,513 B2 * | 4/2013 | Pal | H03K 3/012 |
| | | | 327/201 |
| 10,153,754 B2 * | 12/2018 | Tripathi | H03K 3/356104 |
| 11,990,909 B2 * | 5/2024 | Kong | H03K 3/35625 |
| 2011/0176653 A1 | 7/2011 | Veggetti et al. | |
| 2011/0248759 A1 | 10/2011 | Chi et al. | |
| 2016/0065188 A1 * | 3/2016 | Singhal | H03K 3/356008 |
| | | | 327/210 |
| 2016/0301396 A1 | 10/2016 | Jayapal | |
| 2018/0083602 A1 | 3/2018 | Tripathi et al. | |
| 2018/0159513 A1 | 6/2018 | Reddy et al. | |
| 2022/0094340 A1 | 3/2022 | Venugopal et al. | |

OTHER PUBLICATIONS

Mahmoodi-Meimand et al., "Data-Retention Flip-Flops for Power-Down Applications," ISCAS 2004, IEEE, pp. II-677-II-680.
Rabinowicz et al., "A New Physical Design Flow for a Selective State Retention Based 2 Approach," *J. Low Power Electron. Appl.* 11:35, 2021. (15 pages).

* cited by examiner

*Primary Examiner* — Patrick O Neill
(74) *Attorney, Agent, or Firm* — Seed Intellectual Property Law Group LLP

(57) ABSTRACT

A retention flip flop includes a first latch, a second latch, and a retention latch. The first and second latches are powered by an interruptible primary supply voltage while the retention latch is powered by a secondary supply voltage that is not interrupted. The retention flip-flop receives a single retention control signal that controls whether the flip-flop is in a standard mode or a retention mode. In the retention mode, the flip-flop clock signal is paused.

20 Claims, 9 Drawing Sheets

SINGLE PIN CLOCK-FREE RETENTION FLIP-FLOP

BACKGROUND

Technical Field

The present disclosure generally relates to integrated circuits, and more particularly to integrated circuits with retention flip-flops.

Description of the Related Art

Integrated circuits may include a large number of flip-flops. Each flip-flop generally receives a data value at the data input terminal and passes the data value to an output terminal in accordance with a clock signal. Each flip-flop may include a first latch and a second latch. Each latch may be made up of a plurality of transistors. In addition to the latches, each flip-flop may include additional circuitry.

In some cases, it is desirable for a flip-flop to retain a particular data value for a selected duration of time. In order to retain the data value in a standard flip-flop, power is continuously supplied to all of the circuitry of the flip-flop. This can result in an undesirable amount of power dissipation in the form of leakage currents. If an integrated circuit has a very large number of flip-flops to maintain in a static condition for a selected period of time, then the power dissipation may be very large.

BRIEF SUMMARY

Embodiments of the present disclosure provide an integrated circuit including a retention a flip-flop having a single retention control pin that enables the flip-flop to retain data during a retention mode without operation of the clock. The retention flip-flop includes a first latch, a second latch, a retention latch, and a clock generation circuit. A primary supply voltage is provided to the first latch and the second latch. A secondary supply voltage is provided to the retention latch. The retention flip-flop receives a single retention control signal that causes the flip-flop to transition from a standard mode to a retention mode. In the retention mode, the primary supply voltage is interrupted. The clock generation circuit is also interrupted such that the clock signal is not generated during the retention phase.

In one embodiment, the clock generation circuit receives a global clock signal from a source external to the flip-flop. In the standard mode, the clock generation circuit generates a local clock signal from the global clock signal. The local clock signal controls the operation of the flip-flop. The clock generation circuit includes a control terminal that receives the retention control signal. When the retention control signal indicates entrance into the retention mode, the clock generation circuit stops generating the local clock signal.

In one embodiment, the retention mode has a first phase and a second phase. In the first phase, the primary supply voltage and the local clock signal are interrupted responsive to the retention control signal. In the first phase the retention latch is activated responsive to the retention control signal and captures the current output value of the flip-flop. In the second phase, the primary supply voltage is resumed while the local clock signal remains interrupted. Because the local clock signal remains interrupted, the data input terminal of the flip-flop is blocked from providing the data values to the first latch. During the second phase of the retention mode, the data value stored in the retention latch (or an inverse of the data value stored in the retention latch) is provided to the input of the first latch. Because the first and second latches are active during the second phase, the data value stored in the retention latch is provided to the data output terminal of the flip-flop.

In one embodiment, when the second phase of the retention mode is ended, the local clock signal is resumed. This results in resumption of the standard mode of the flip-flop in which a data value received at the data input terminal of the flip-flop is passed to the data output terminal of the flip-flop.

In one embodiment, a method includes powering a first latch and a second latch of a retention flip-flop with a primary supply voltage and powering a retention latch of the flip-flop with a secondary supply voltage. The method includes interrupting the primary supply voltage responsive to receiving a retention control signal at the retention flip-flop and latching an output data value of the flip-flop with the retention latch responsive to receiving the retention control signal.

In one embodiment, an integrated circuit includes a retention flip-flop. The retention flip-flop includes a first latch configured to receive a primary supply voltage and a second latch configured to receive the primary supply voltage. The retention flip-flop includes a retention latch configured to receive a secondary supply voltage and including a first terminal configured to receive a retention control signal to activate the retention latch and a clock generation circuit configured to generate a clock signal and including a second terminal configured to receive the retention control signal.

In one embodiment, a method includes operating a retention flip-flop in a standard mode including supplying a primary supply voltage to a first latch and a second latch of the retention flip-flop supplying a secondary supply voltage to a retention latch of the retention flip-flop and generating a clock signal. In one embodiment, the method includes transitioning the retention flip-flop from the standard mode to a retention mode responsive to receiving a retention control signal. The retention mode includes interrupting generation of the clock signal responsive to receiving the retention control signal.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
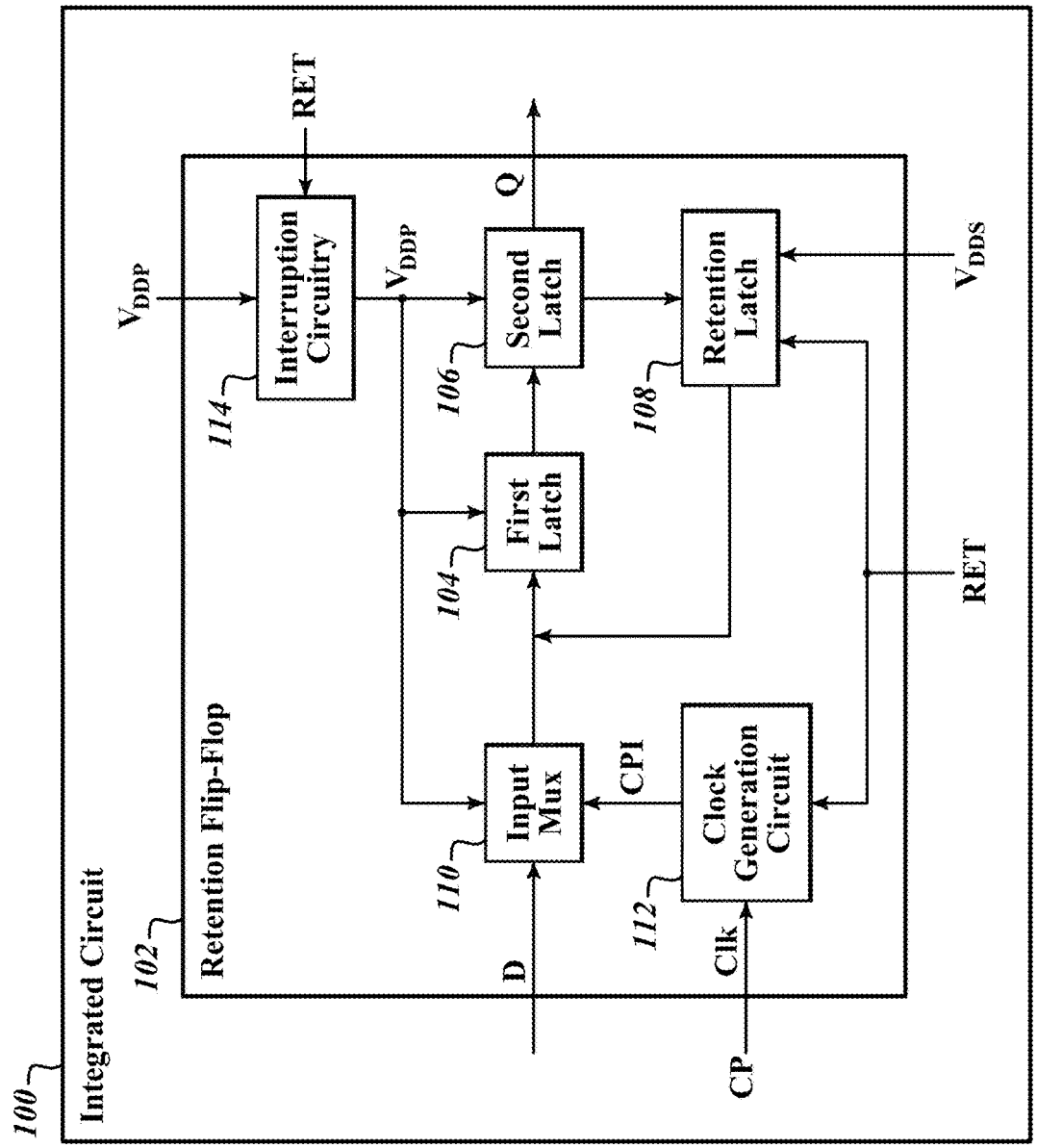
FIG. 1 is a block diagram of an integrated circuit including a retention flip-flop, in accordance with one embodiment.

FIG. 1 is a block diagram of an integrated circuit 100, in accordance with one embodiment. The integrated circuit 100 includes a retention flip-flop 102. The retention flip-flop 102 includes a first latch 104, a second latch 106, and a retention latch 108. The retention flip-flop further includes an input multiplexer 110 and the clock generation circuitry 112. As will be set forth in more detail below, the retention flip-flop 102 is a single pin retention flip-flop configured to operate in a clock free retention mode.

The retention flip-flop 102 includes a first power supply terminal that receives a primary supply voltage VDD P. The retention flip-flop 102 includes a second power supply terminal that receives a secondary supply voltage VDD S. Though not shown in FIG. 1, the retention flip-flop 102 may also include a ground terminal configured to receive ground voltage.

The primary supply voltage VDDP is supplied to the first latch 104 and the second latch 106. Though not shown in FIG. 1, the primary supply voltage VDDP may also be supplied to the input multiplexer 110 and the clock generation circuit 112. The secondary supply voltage VDDS is supplied to the retention latch 108. As will be set forth in more detail below, the primary supply voltage VDDP is interruptible, while the secondary supply voltage VDDS is not interruptible.

In one embodiment, the primary supply voltage VDDP is provided to the various components of the retention flip-flop 102 via the interruption circuitry 114. In particular, the interruption circuitry 114 receives the primary supply voltage VDDP and then provides the primary supply voltage VDDP to the primary supply voltage VDDP to the components of the retention flip-flop 102. During a standard mode of the retention flip-flop 102, the interruption circuitry 114 provides the primary supply voltage VDDP to the components of the retention flip-flop 102. As will be set forth in more detail below, the interruption circuitry 114 can interrupt supply of the primary supply voltage VDDP during a retention mode of the retention flip-flop 102. Further details regarding the standard mode and the retention mode are provided below.

In one embodiment, the interruption circuitry 114 is not part of the retention flip-flop 102. Instead, the interruption circuitry 114 may be external to the retention flip-flop 102. The external interruption circuitry 114 may selectively supply or interim supply of the primary supply voltage VDDP delay plurality of retention flip-flops 102. Various other schemes, circuits, and methods can be utilized to interrupt or suspend supply of the primary supply voltage VDDP to components of a retention flip-flop 102 without departing from the scope of the present disclosure.

The retention flip-flop 102 includes a data input terminal D coupled to the input multiplexer 110. The data input terminal D corresponds to a terminal by which input data values are provided to the retention flip-flop 102. The retention flip-flop 102 includes a data output terminal Q. The data output terminal Q corresponds to a terminal by which output data values are provided from the retention flip-flop 102.

The retention flip-flop 102 includes a clock input terminal CLK. The clock input terminal CLK receives a global clock signal CP. The clock generation circuit 112 receives the global clock signal CP and generates a local clock signal CPI. The local clock signal CPI may have a same frequency as the global clock signal CP. Though not shown in FIG. 1, the clock generation circuit 112 may also generate a complementary local clock signal CPN corresponding to the logical complement of the global clock signal CP. The clock generation circuit 112 may supply the local clock signal CPI to the input multiplexer 110, the first latch 104, and the second latch 106. As will be set forth in more detail below, the clock generation circuit 112 can interrupt supply of the local clock signal CPI in the retention mode.

In the standard mode, the input multiplexer 110, the first latch 104, and the second latch 106 receive the primary supply voltage VDDP. In the standard mode, the clock generation circuit 112 generates the local clock signal CPI and provides the local clock signal CPI to the input multiplexer 110, the first latch 104, and the second latch 106.

The input multiplexer 110 receives the input data value from the input data terminal D. Though not shown in FIG. 1, the input multiplexer 110 may also receive other inputs. The input multiplexer 110 may receive a selection signal (not shown) that determines which of the inputs will be provided to the output of the input multiplexer 110. For simplicity of description of the function of the retention flip-flop 102, only a single input is shown for the input multiplexer 110. Furthermore, in the standard mode it will be assumed that the single input is selected by the selection signal.

In one embodiment, the multiplexer 110 passes the input signal (D) to the output of the input multiplexer 110 upon a transition in the local clock signal CPI. Accordingly, in one embodiment, the input multiplexer 110 only outputs a newly received input data value when the local clock signal CPI is active. In one embodiment, the input multiplexer 110 outputs the logical compliment of the input data value.

The input of the first latch 104 is coupled to the output of the input multiplexer 110. In the standard mode, the first latch 104 receives the data value from the input multiplexer 110 and outputs the logical complement of the data value. The input of the second latch 106 is coupled to the output of the first latch 104. In the standard mode the second latch 106 receives the inverted data value from the first latch 104 and outputs the data value to the data output terminal Q. Accordingly, in the standard mode the first and second latches 104 and 106 invert whatever value they received.

In the standard mode, a data value is received at the input multiplexer 110. Upon the next transition in the local clock signal CPI, the data value is passed through the first latch and the second latch to the data output terminal Q. Accordingly, with each clock signal, and a data value can be passed from the data input terminal D to the data output terminal Q.

As described previously, in some cases it is beneficial to place the retention flip-flop 102 into a type of low-power mode without losing a current data value. In a standard flip-flop, if power is removed entirely from the flip-flop, then the data value will be lost. If no new data value is expected to be received for a relatively long duration of time, then retaining that data value at the standard flip-flop can be costly in terms of power because all of the circuitry of the flip-flop will be active. The retention flip-flop 102 includes the retention latch 108 in order to enable reduced power consumption in a retention mode. In particular, in the retention mode the primary supply voltage VDDP is interrupted for at least a portion of the retention mode. In the retention mode of the secondary supply voltage VDDS is not interrupted but remains active. This causes the retention latch 108 to store the current output data value when the retention mode is entered. Because most of the circuitry of the retention flip-flop 102 is an active during the retention mode due to the interruption of the primary supply voltage VDDP, the retention mode results in reduced power consumption while retaining the current output data value in the retention latch 108.

In one embodiment, the retention flip-flop 102 is a single pin clock free retention flip-flop. The retention flip-flop 102 includes a single retention input terminal that receives a retention control signal RET The single retention input terminal corresponds to the "single pin" of the retention flip-flop 102. As will be set forth in more detail below, in one embodiment the retention control signal RET alone can enable and control transitions between the standard mode and the retention mode.

In one embodiment, the clock generation circuit 112, the retention latch 108, and the interruption circuitry 114 each receive the retention control signal RET In practice, the retention control signal RET can have a first value or second value. The retention control signal RET having the first value may correspond to operation of the retention flip-flop 102 in the standard mode. The retention control signal RET having the second value may correspond to operation of the retention flip-flop 102 in the retention mode. The retention mode may be entered responsive to the retention control signal RET transitioning from the first value to the second value. As used herein, "reception of the retention control signal" may correspond to a transition of the retention control signal RET from the first value to the second value. Furthermore, the phrase responsive to "reception of the retention control signal" and the equivalence may correspond to a transition of the retention control signal RET from the first value to the second value.

In one embodiment, the clock generation circuit 112 is controlled by the retention control signal RET When the retention control signal RET indicates the standard mode, then the clock generation circuit 112 actively generates the local clock signal CPI. When the retention control signal RET indicates the retention mode, then the clock generation circuit 112 does not generate the local clock signal CPI. Accordingly, the clock generation circuit 112 may stop generating the local clock signal CPI responsive to reception of the retention control signal RET.

In one embodiment, when the retention control signal RET indicates the retention mode, the retention latch 108 captures and stores the current data value (or the inverse of the current data value) at the data output terminal Q. Because the retention latch 108 receives the secondary supply voltage VDDS that is not interrupted in the retention mode, the retention latch 108 continues to store the output data value during the retention mode.

In one embodiment, the interruption circuitry 114 receives the retention control signal RET When the retention control signal RET indicates entrance into the retention mode, the interruption circuitry 114 interrupts supply of the primary supply voltage VDDP to the input multiplexer 110, the first latch 104, and the second latch 106. This causes reduced power consumption of the retention flip-flop 102 in the retention mode.

In one embodiment, when the retention control signal RET indicates return to the standard mode, the retention latch 108 provides the retained data value to the data output terminal Q. Various methods and circuitry can be utilized to provide the retained data value from the retention latch 108 to the data output terminal Q upon resumption of the standard mode.

In one embodiment, the retention mode has a first phase and a second phase. In the first phase of the retention mode, the clock generation circuit 112 does not generate the local clock signal CPI. In the first phase of the retention mode the interruption circuitry 114 does not supply the primary supply voltage VDDP. The result is that neither the input multiplexer 110, nor the first and second latches 104 and 106 are active in the first phase of the retention mode.

In one embodiment, in the second phase of the retention mode, the interruption circuitry 114 resume supply of the primary supply voltage VDDP. In the second phase of the retention mode, the clock generation circuit 112 does not supply the local clock signal CPI. Accordingly, in the second phase of the retention mode, the first latch 104 and the second latch 106 become active again. Because the output of the retention latch is coupled to the input of the first latch 104, during the second phase of the retention mode, the data value stored in the retention latch 108 is provided to the first latch 104. The data value is then provided from the first latch 104 to the second latch 106 and from the second latch 106 to the data output terminal Q. Accordingly, the second phase of retention mode corresponds to preparation to resume the standard mode. The retained data value is provided to the data output terminal Q during the second phase of the retention mode.

Because the local clock signal CPI is not generated during the second phase of retention mode, the input multiplexer 110 is still not operable. In other words, if a new data value is received during either the first phase or the second phase of the retention mode, the input multiplexer 110 cannot provide the newly received data value to the first latch 104 because the local clock signal CPI is not active. This ensures that even if the data values received during a portion of the retention mode, these data values will not supplant the retained data value in the retention latch 108 and will not be provided to the data output terminal Q.

When the second phase of the retention mode is complete, the retention flip-flop 102 again enters the standard mode. In the standard mode, the local clock signal CPI is resumed. This results in the input multiplexer 110 resuming supply of newly received data input values to the first latch 104. Various other schemes, circuitry, and components can be utilized without departing from the scope of the present disclosure.

Figure 2A:
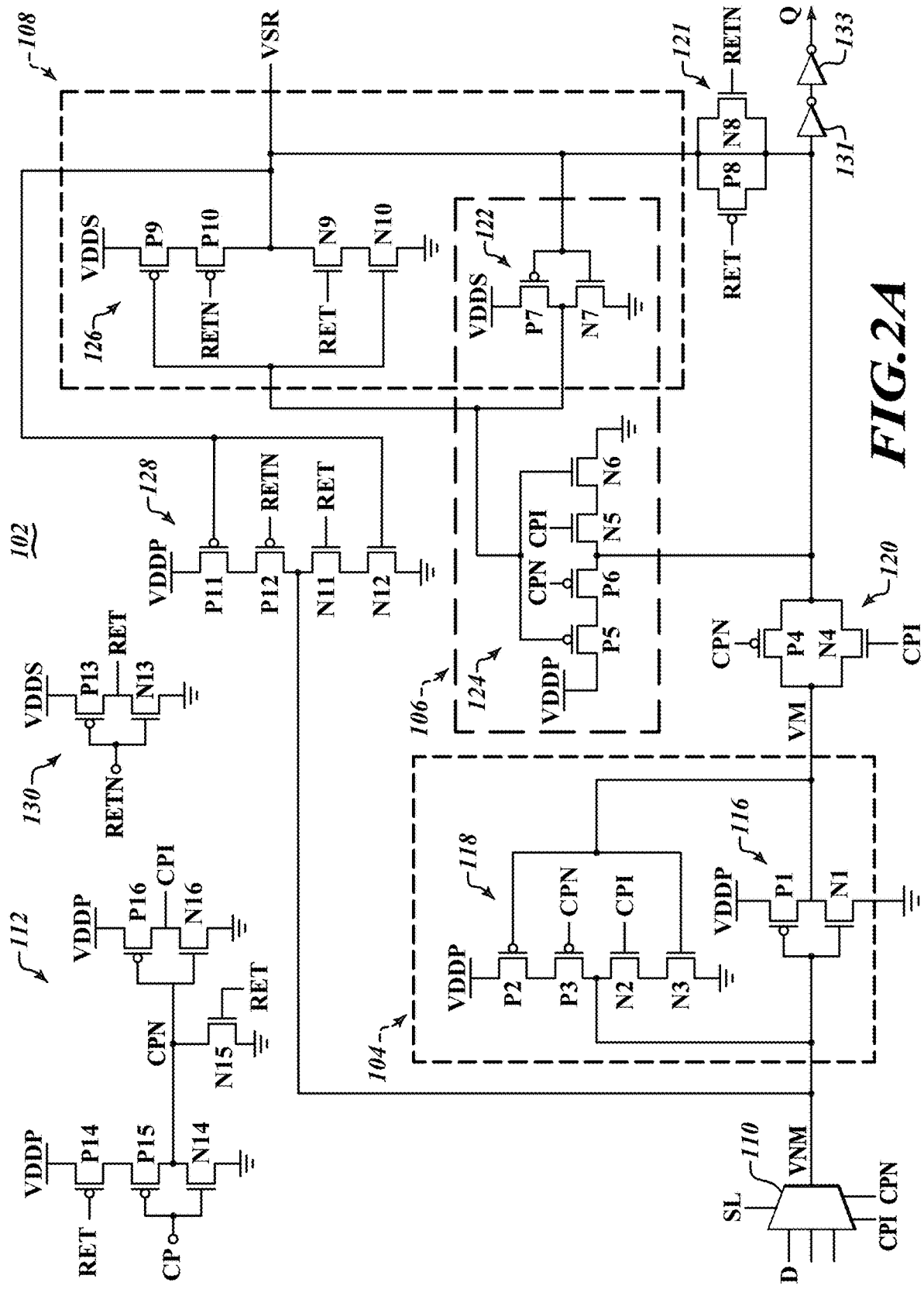
FIG. 2A is a schematic diagram of a retention flip-flop, in accordance with one embodiment.

FIG. 2A is a schematic diagram of a retention latch 102, in accordance with one embodiment. The retention latch 102 of FIG. 2A is one example of a retention latch 102 of FIG. 1. As will be set forth in more detail below, the retention latch 102 of FIG. 2A can effectively and efficiently switch between a standard mode and a retention mode.

The retention latch 102 includes an input multiplexer 110. The input multiplexer 110 receives a plurality input signals. One of the input signals is coupled to the data input terminal D of the retention flip-flop 102. The other input signals are not labeled. The input multiplexer 110 receives the local clock signal CPI and the complementary local clock signal CPN. The input multiplexer 110 receives a selection signal SL. The selection signal SL is a control signal that determines which input is selected for provision to the output of the multiplexer 110. The multiplexer 110 provides the value at the selected input to the output upon transitions in the local clock signal CPI and the complementary local clock signal CPN. The voltage on the circuit node coupled to the output of the multiplexer 110 is labeled VNM and will be described in relation to FIG. 3A.

The retention latch 102 includes a first latch 104. The first latch 104 includes a first inverter 116 and a second inverter 118 cross coupled together. The input of the first inverter 116 corresponds to the input of the first latch 104 and is coupled to the output of the multiplexer 110. The first inverter 116 includes a first PMOS transistor P1 and a first NMOS transistor N1 coupled together as an inverter between the primary supply voltage VDDP and ground. The gate terminals of P1 and N1 correspond to the input of the first inverter 116. The common drain terminals of the transistors P1 and N1 correspond to the output of the inverter 116. The voltage at the node corresponding to the output of the first latch 104 is labeled VM, as will be described in relation to FIG. 3A.

The second inverter 118 is a tristate inverter. The second inverter 118 includes PMOS transistors P2 and P3 and NMOS transistors N2 and N3 are coupled between the primary supply voltage VDDP and ground. The gate terminals of P2 and N3 correspond to the input of the inverter 118 and are coupled to the output of the inverter 116. The common drain terminals of the transistors P3 and N2 correspond to the output of the inverter 118 and are coupled to the input of the inverter 116. The gate terminals of the transistors P3 and N2 receive CPN and CPI, respectively. The second inverter 118 is a tristate inverter in that the inverter 118 can be rendered inoperable if CPN is high and CPI is low.

The retention flip-flop 102 includes a pass gate 120. The pass gate 120 includes a PMOS transistor P4 and an NMOS transistor N4. The input of the pass gate 120 is coupled to the output of the latch 104. The gate terminal of P4 receive CPN. The gate terminal of N4 receives the CPI. The pass gate 120 will not pass a signal if CPN is high and CPI is low.

The retention flip-flop 102 includes a second pass gate 121. The second pass gate 121 includes transistors P8 and N8. The input of the pass gate 121 is coupled to the output of the pass gate 120. The gate terminal of N8 receives the complementary retention control signal RETN. The gate terminal of P8 receives the retention control signal RET The pass gate 121 will not pass a signal if RETN is low and RET is high.

The retention flip-flop 102 includes a second latch 106. The second latch 106 includes a first inverter 122 and a second inverter 124 cross coupled together. The input of the inverter 122 corresponds to the input of the latch 106 is coupled to the output of the pass gate 121. Accordingly, the input of the latch 106 is coupled to the output of the latch 104 via the pass gates 120 and 121. The inverter 122 includes a transistor P7 and a transistor N7 coupled between the secondary supply voltage VDDS and ground. The gate terminals of P7 and N7 correspond to the inputs of the inverter 122. The common drain terminals of P7 and N7 correspond to the output of the inverter 122.

The inverter 124 is a tristate inverter and includes transistors P5, P6, N5, and N6 coupled between the primary supply voltage VDDP and ground. The gate terminals of P5 and N6 correspond to the input terminal of the inverter 124 and the coupled to the output terminal of the inverter 122. The common drain terminals of P6 and N5 correspond to the output of the inverter 124 and are coupled between the pass gate 120 and the pass gate 121. Accordingly, the output of the inverter 124 is coupled to the input of the inverter 122 via the pass gate 121. The gate terminals of P6 and N5 receive CPN and CPI, respectively. Accordingly, the inverter 124 is a tristate inverter and the sense that the inverter 124 can be rendered inoperable if CPN is high and CPI is low. Other configurations of the second latch 106 can be utilized without departing from the scope of the present disclosure.

The retention flip-flop 102 includes a retention latch 108. The retention latch 108 shares the inverter 122 with the second latch 106. The retention latch 108 also includes an inverter 126 cross coupled together with the latch 122. The input of the inverter 122 corresponds to the input of the retention latch 108.

The latch 126 includes transistors P9, P10, N9, and N10 coupled between the secondary supply voltage VDDS and ground. The gate terminals of P9 and N10 correspond to the input of the inverter 126 and the coupled to the output of the inverter 122. The common drain terminals of P10 and N9 correspond to the output of the inverter 126 and are coupled to the input of the inverter 122. The gate terminals of P10 and N9 receive RETN and L, respectively. The inverter 126 is a tristate inverter in that the inverter 126 can be rendered inoperable if RETN is high and RET is low.

The input of the retention inverter latch 108 corresponds to a retention node of the retention flip-flop 102. The voltage of the retention node is labeled VSR, as will be described in relation to FIG. 3A. Both the inverter 122 and the inverter 126 of the retention latch 102 are powered by the secondary supply voltage VDDS. Accordingly, the retention latch 108 is powered by the secondary supply voltage VDDS.

The retention latch 102 includes a tristate inverter 128 coupled between the retention latch 108 and the input of the first latch 104. The inverter 128 includes transistors P11, P12, N11, and N12 coupled between the primary supply voltage VDDP and ground. The gate terminals of P11 and N12 correspond to the input of the inverter 128 and are coupled to the input of the retention latch 108. The common drain terminals of P12 and N11 correspond to the output of the inverter 128 and the coupled to the input of the first latch 104. The gate terminals of P12 and N11 receive RETN and L, respectively. The inverter 128 is a tristate inverter in that the inverter 128 can be rendered inoperable if RETN is high and RET is low.

The retention latch 102 includes a clock generation circuit 112. The clock generation circuit 112 includes transistors P14, P15, and N14 coupled between the primary supply voltage VDDP and ground. The gate terminal of the transistor P14 receives the retention control signal RET The gate terminals of P15 and N14 receive the global clock signal CP. The clock generation circuit 112 includes a transistor N15 having a source terminal coupled to ground, a drain terminal coupled to the common drain terminals of P15 and N14, and a gate terminal that receives the retention control signal RET The clock generation circuit 112 includes transistors P16 and N16 coupled between the primary supply voltage VDDP and ground. The gate terminals of P16 and N16 are coupled to the common drain terminals of P15 and N14.

Operation of the clock generation circuit 112 will now be described. If the retention control signal RET is low and VDDP is active, then the transistor P14 is on and the transistors P15 and N14 act as an inverter that outputs the complementary local clock signal CPN corresponding to the logical complement of the global clock signal CP (and CPI). If the retention control signal RET is low, then the transistor N15 is off. If VDDP is active, then P16 and N16 act as an inverter that receives the complementary local clock signal CPN and generates the local clock signal CPI as the logical complement of CPN. Accordingly, if the primary supply voltage VDDP is active and the retention control signal is low, the clock generation circuit is active.

However, if the retention control signal RET is high, then CPN will be shorted to ground and will remain low without transitions. If VDDP is active, then CPI will remain high, without transitions. If VDDP is off, then CPI may float or may remain high, without transitions. Accordingly, the value of the retention control signal RET determines whether or not the clock generation circuit 112 will generate CPN and CPI as active clock signals. The clock generation circuit 112 may stop generating CPN and CPI as active clock signals responsive to the retention control signal RET.

The retention flip-flop 102 includes an inverter 130. The inverter 130 includes transistors P13 and N13 coupled between the secondary supply voltage VDDS and ground. The gate terminals of N13 and P13 receives the complementary retention control signal RETN. The common drain terminals of the transistors P13 and N13 generate the retention control signal RET is the logical complement of the complementary retention control signal RETN.

In one embodiment, the retention flip-flop 102 includes an inverter 131 and that inverter 133 coupled together in series between the input of the pass gate 121 and the data output terminal Q. The output of the inverter 133 is coupled to the data output terminal Q.

Figure 2B:
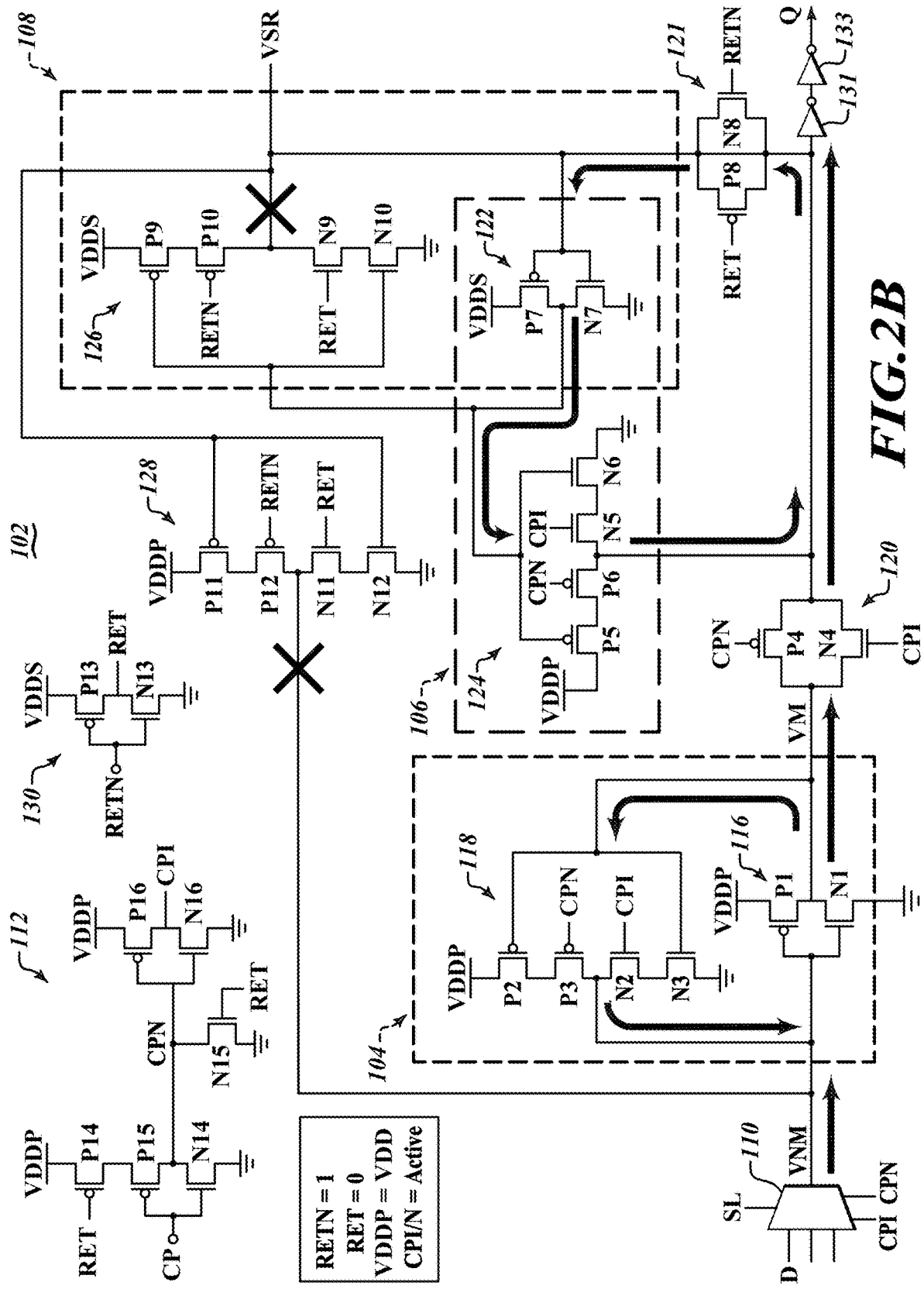
FIG. 2B is a schematic diagram of the retention flip-flop of FIG. 2A in a standard mode, in accordance with one embodiment.
Figure 2C:
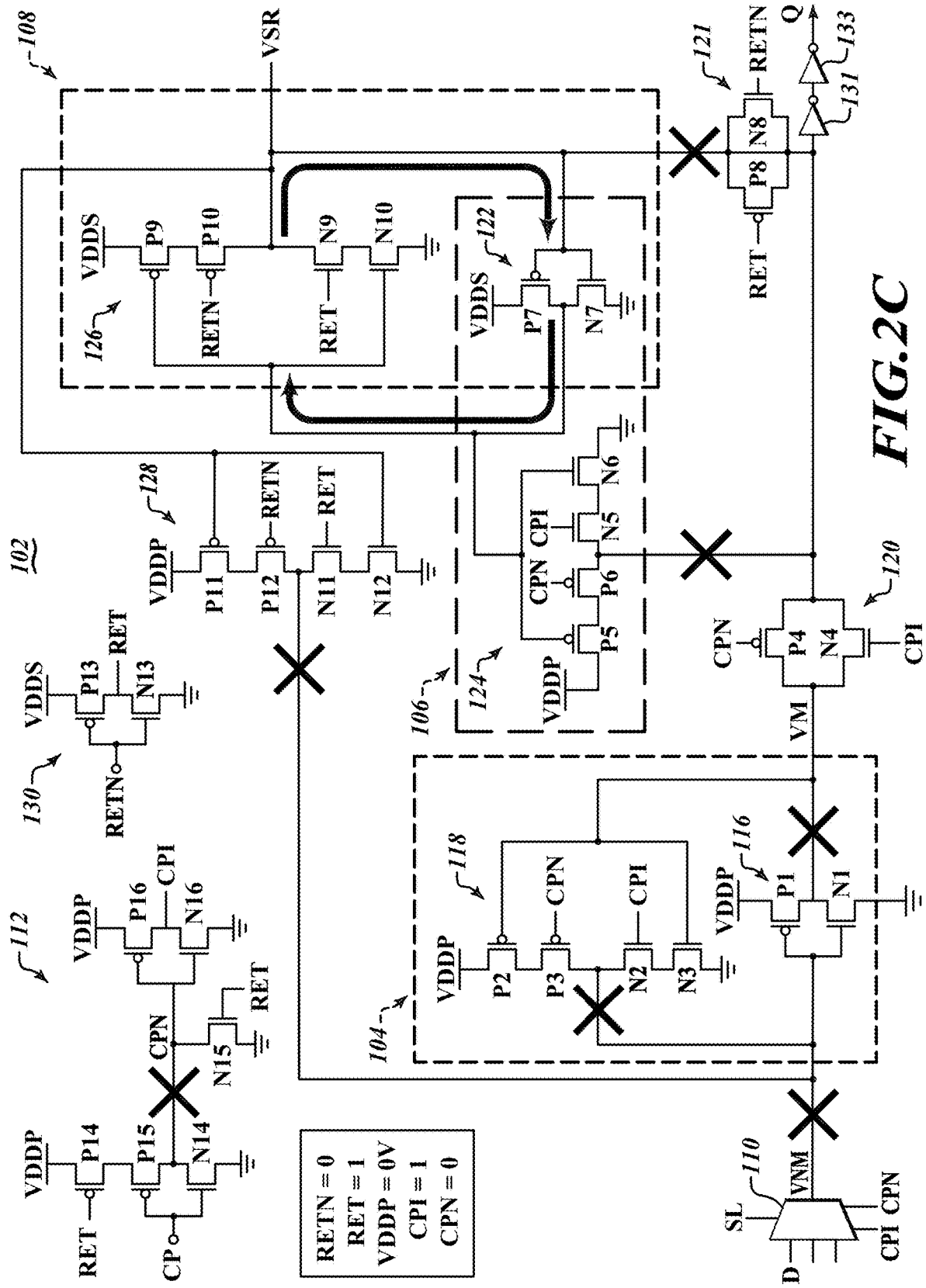
FIG. 2C is a schematic diagram of the retention flip-flop of FIG. 2A in a first phase of the retention mode, in accordance with one embodiment.
Figure 2D:
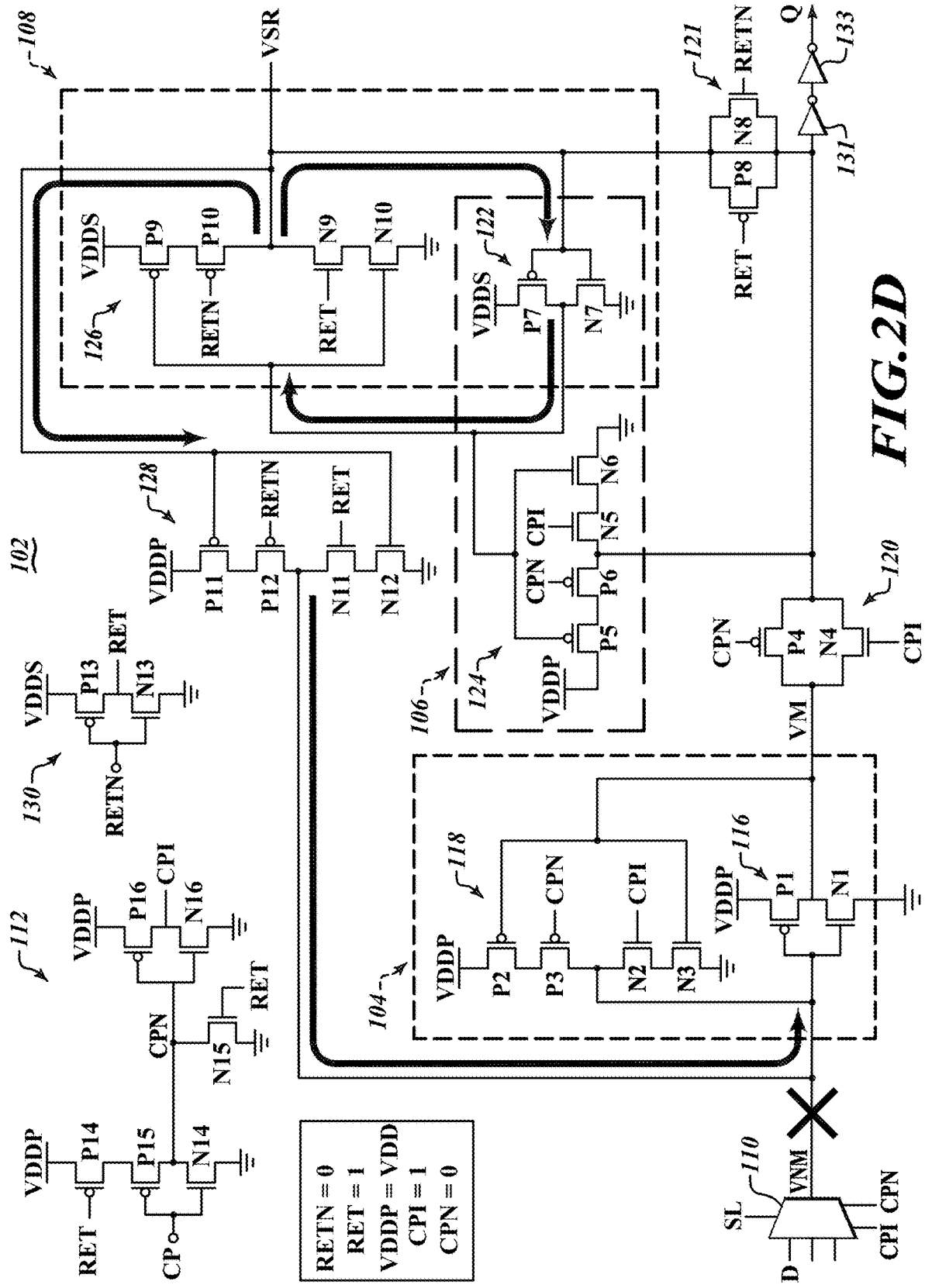
FIG. 2D is a schematic diagram of the retention flip-flop of FIG. 2a and a second phase of the retention mode, in accordance with one embodiment.

FIGS. 2B-2D correspond to the retention flip-flop 102 in various modes of operation, according to one embodiment. FIGS. 2B-2D utilize arrows to illustrate signal flows within the retention flip-flop 102 for the various modes of operation. FIGS. 2B-2D utilize large "X"s to illustrate portions of the retention flip-flop 102 through which signals do not flow for the various modes of operation.

FIG. 2B illustrates the retention flip-flop of FIG. 2 a in a standard mode, according to one embodiment. In the standard mode, the retention control signal RET is low and the complementary retention control signal RETN is high. The primary supply voltage VDDP is on and the clock signals CPI and CPN are active (i.e., oscillating).

Because the clock signals CPI and CPN are oscillating, the multiplexer 110 passes data values from the data input terminal D to the input of the first latch 104. The inverter 116 of the first latch inverts the input data value and outputs the merged data value. The second inverter 118 is active, causing the latch 104 to be operative. The pass gate 120 opens and closes intermittently with the transitions in the active clock signals CPI and CPN, thereby passing the inverted data value each clock cycle. The pass gate 121 passes the inverted data value to the input of the second latch 106 because RET is low and RETN is high. The inverted data value is also passed to the output terminal Q via the inverters 131 133. Accordingly, in one embodiment, the input data value is inverted when passed to the data output terminal. However, in one embodiment, the retention flip-flop 102 may be structured so that the inverted data value is again inverted before being passed to the data output terminal Q.

The input of the latch 106 receives the inverted data value via the pass gates 120 and 121. The inverter 122 is active because it is supplied by the secondary supply voltage VDDS. The inverter 124 is active because CPN and CPI are oscillating and the primary supply voltage VDDP is on. The retention latch 108 is inactive because the tri-state latch 126 is inactive because RETN is high and RET is low. The inverter 128 is likewise not active because RETN is high and RET is low.

In FIG. 2C, the retention flip-flop 102 has entered a first phase of the retention mode, according to one embodiment. In the first phase of the retention mode the retention control signal RET has gone high and the complementary retention control signal RETN has gone below. The interruption circuitry 114 has interrupted supply of the primary supply voltage VDDP responsive to the retention control signal RET going high (or responsive to the complementary retention control signal RETN going low). With RET high, the clock generation circuit 112 is not active. CPI is locked to the high value and CPN is locked to the low value.

Because CPI and CPN are not active, the multiplexer 110 does not pass new data values from the data input terminal D. Because the primary supply voltage is low, the inverters 116, 118, 124, and 128 are inactive. The pass gate 121 does not pass a signal because RET is high and RETN is low. The retention latch 108 is active because the secondary supply voltage VDDS is not interrupted and because the latch 126 is activated by RETN being low and elevating high. Accordingly, the current data output value is latched at the input of the retention latch 108. The voltage VSR corresponds to the data value present at the data output terminal Q at the time that the retention mode is entered.

In FIG. 2D, the retention flip-flop 102 has entered a second phase of the retention mode, according to one embodiment. The second phase of the retention mode corresponds to a phase in which the retain the data value is provided to the data output terminal Q while the multiplexer 110 is still prevented from passing in the newly received input data values. In the second phase of the retention mode, the interruption circuitry 114 has resumed supply of the primary supply voltage VDDP. However, the local clock signal CPI is still not active and is locked at the high value, while the complementary local clock signal CPN is locked at the low value.

In the second phase of the retention mode, the multiplexer 110 is inactive because the clock signals CPI and CPN are not oscillating. The pass gate 120 is active. The pass gate 121 is inactive. The inverter 116 of the first latch 104 is active because the primary supply voltage VDDP is high. The inverter 118 is still active because CPN is high and CPI is low. The inverter 128 is active because the primary supply voltage is high, RETN is low and RET is high. The retention flip-flop 108 is active because RETN is low and RET is high.

The retained data value from the latched input of the retention latch 108 is passed to the inverter 128 and inverted. The inverted retained data value is passed to the inverter 116 and inverted back to the retained data value. The retained data value is then passed to the pass gate 120 and on to the data output terminal Q. In this way, the retained data value is supplied to the data output terminal Q during the second phase of the retention mode while the multiplexer 110 is inoperable.

Figure 3A:
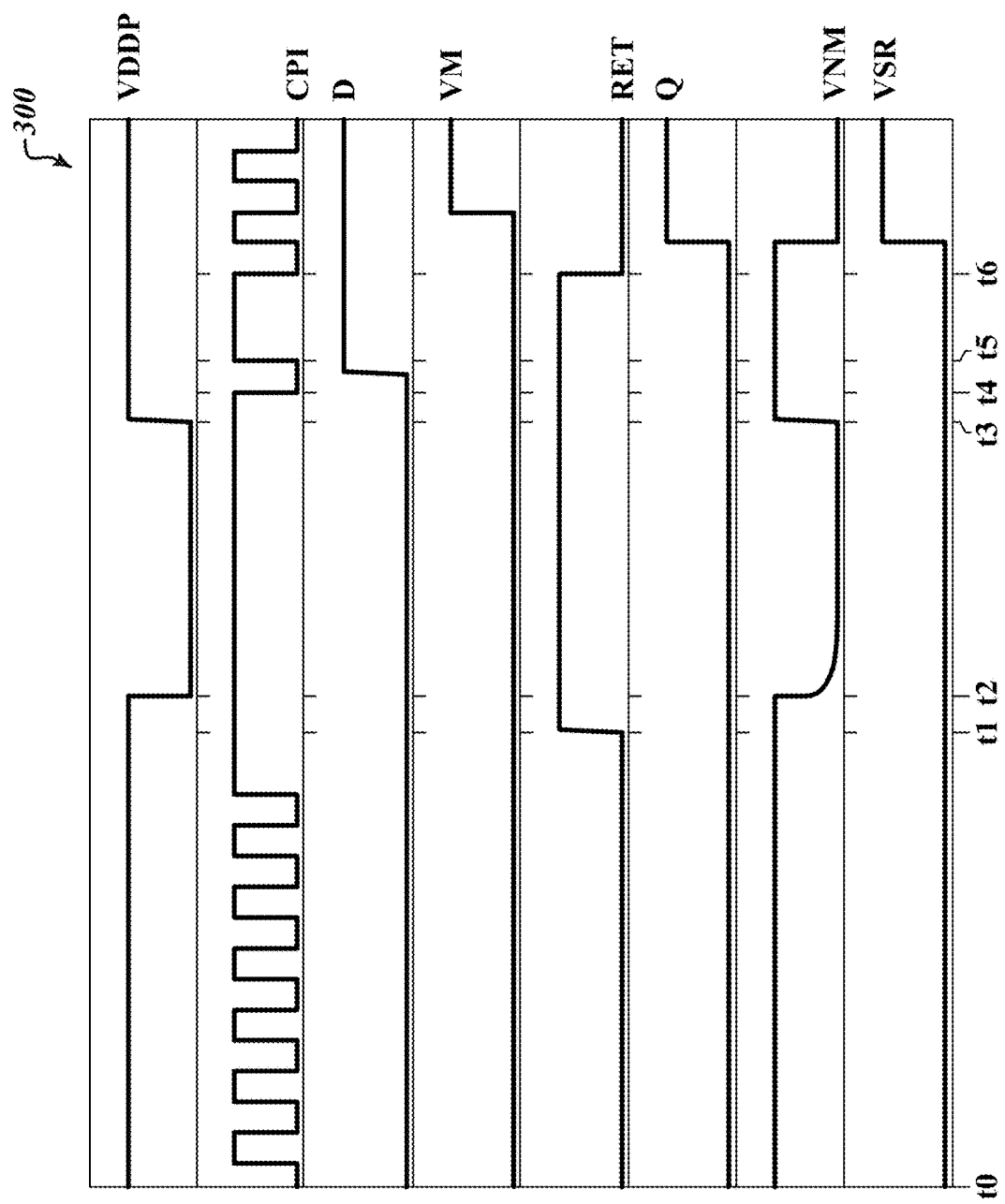
FIG. 3A is a timing diagram including a plurality of signals associated with a retention flip-flop, in accordance with one embodiment.

FIG. 3A is a timing diagram 300 illustrating signals associated with the retention flip-flop of FIGS. 2A-2D, according to one embodiment. In FIG. 3A, a value of 0 is initially stored at the data output terminal Q and in the retention node VSR. Between times T0 and T1, the flip-flop 102 is in a standard mode. The input data value is low and the data output value is low (although in some cases the data output value may be inverted with respect to the data input value, depending on the configuration of the retention flip-flop). The voltage VSR on the retention node is low. The primary supply voltage VDDP is high. The local clock signal CPI is oscillating and the voltage VM is low. The voltage VNM is high. The retention control signal RET is low.

At time T1, the first phase of the retention mode is entered as the retention control signal RET goes high. This causes CPI to remain high and to stop oscillating. This causes the primary supply voltage VDDP to be interrupted (go low). At time T2 the voltage VNM dissipates to the low value. The retention latch latches the voltage VSR at the low value.

At time T3, the second phase of the retention mode is entered. The primary supply voltage VDDP goes high again. This may cause CPI to momentarily go low between times T4 and T5. The retention control signal RET remains high. VNM goes high. VSR and remains low. To illustrate a benefit of the circuit of FIGS. 2A-2D, if the input voltage goes high at time T4, the retention voltage VSR and the voltage at the data output terminal Q remain low because the local clock signal is not oscillating, thereby preventing the input multiplexer 110 from outputting any new voltage.

At time T6, the retention control signal RET goes low, signifying that the retention mode has ended and that the standard mode has begun again. This causes CPI to begin oscillating again. With CPI oscillating, the multiplexer 110 is again active. This causes the high-voltage value at the data input terminal D to be passed to the data output terminal Q as well as to the storage node of the retention latch.

Figure 3B:
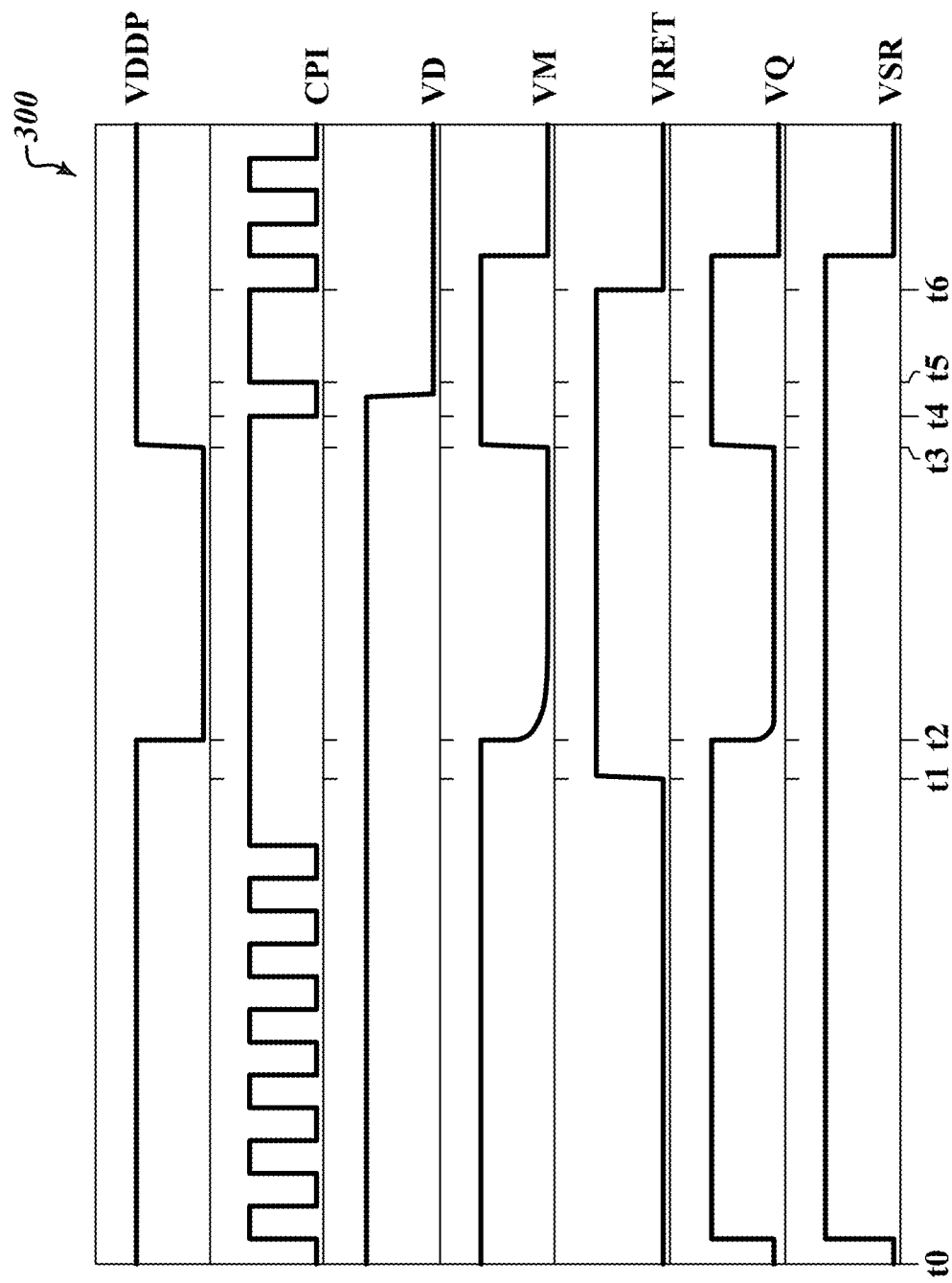
FIG. 3B is a timing diagram including a plurality of signals associated with a retention flip-flop, in accordance with one embodiment.

FIG. 3B is a timing diagram 300 illustrating signals associated with the retention flip-flop of FIGS. 2A-2D, according to one embodiment. FIG. 3B is similar to FIG. 3A, except that a value of 1 is initially stored at the data output terminal Q and in the retention node VSR. Furthermore, VNM is not shown in FIG. 3B. Between times T0 and T1, the flip-flop 102 is in the standard mode. The input data value is high and the data output value is high (although in some cases the data output value may be inverted with respect to the data input value, depending on the configuration of the retention flip-flop). The voltage VSR on the retention node is high. The primary supply voltage VDDP is high. The local clock signal CPI is oscillating and the voltage VM is low. The retention control signal RET is low.

At time T1, the first phase of the retention mode is entered as the retention control signal RET goes high. This causes CPI to remain high and to stop oscillating. This causes the primary supply voltage VDDP to be interrupted (go low). At time T2 the voltage VM dissipates to the low value. The retention latch latches the voltage VSR at the high value.

At time T3, the second phase of the retention mode is entered. The primary supply voltage VDDP goes high again. This may cause CPI to momentarily go low between times T4 and T5. The retention control signal RET remains high. VM goes high. VSR remains high. To illustrate a benefit of the circuit of FIGS. 2A-2D, if the input voltage goes low at time T4, the retention voltage VSR and the voltage at the data output terminal Q remain high because the local clock signal is not oscillating, thereby preventing the input multiplexer 110 from outputting any new voltage.

At time T6, the retention control signal RET goes low, signifying that the retention mode has ended and that the standard mode has begun again. This causes CPI to begin oscillating again. With CPI oscillating, the multiplexer 110 is again active. This causes the low voltage value at the data input terminal D to be passed to the data output terminal Q as well as to the storage node of the retention latch.

Figure 4:
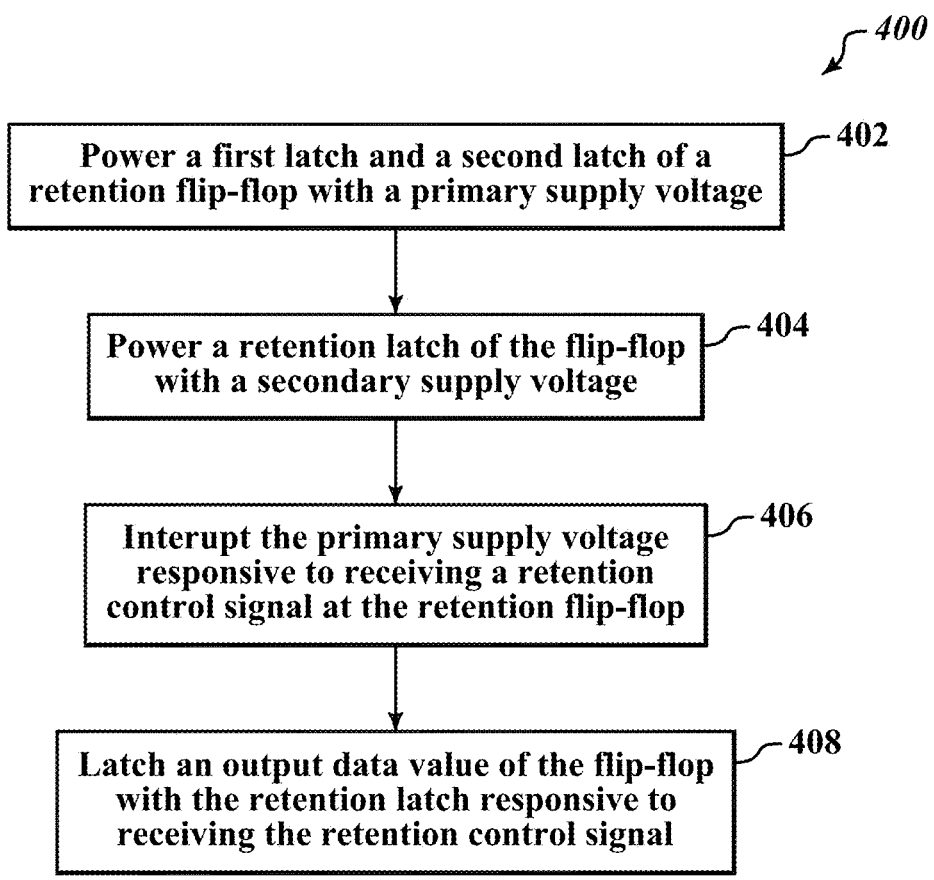
FIG. 4 is a flow diagram of a method for operating a retention flip-flop, in accordance with one embodiment.

FIG. 4 is a flow diagram of a method 400 for operating a retention flip-flop, according to one embodiment. The method 400 can utilize processes, components, and circuitry described in relation to FIGS. 1-3B. At 402, the method 400 includes powering a first latch and a second latch of a retention flip-flop with a primary supply voltage. At 404, the method 400 includes powering a retention latch of the flip-flop with a secondary supply voltage. At 406, the method 400 includes interrupting the primary supply voltage responsive to receiving a retention control signal at the retention flip-flop. At 408, the method 400 includes latching an output data value of the flip-flop with the retention latch responsive to receiving the retention control signal.

Figure 5:
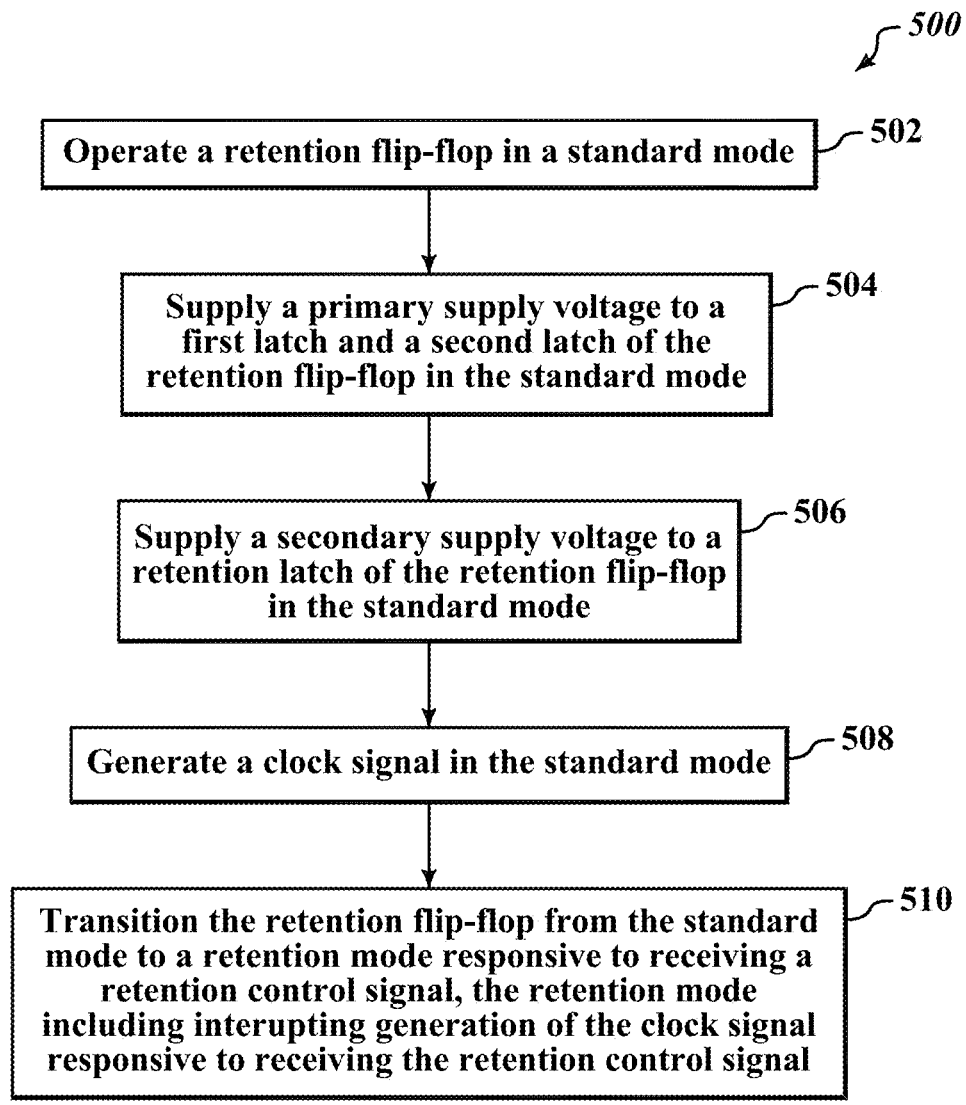
FIG. 5 is a flow diagram of a method for operating a retention flip-flop, in accordance with one embodiment.

FIG. 5 is a flow diagram of a method 500 for operating a retention flip-flop, according to one embodiment. The method 500 can utilize processes, components, and circuitry described in relation to FIGS. 1-3B. At 502, the method 500 includes operating a retention flip-flop in a standard mode. At 504, operating in the standard mode includes supplying a primary supply voltage to a first latch and a second latch of the retention flip-flop. At 506, operating in the standard mode includes supplying a secondary supply voltage to a retention latch of the retention flip-flop. At 508 operating in the standard mode includes generating a clock signal. At 510, the method includes transitioning the retention flip-flop from the standard mode to a retention mode responsive to receiving a retention control signal, the retention mode including interrupting generation of the clock signal responsive to receiving the retention control signal.

In one embodiment, a method includes powering a first latch and a second latch of a retention flip-flop with a primary supply voltage and powering a retention latch of the flip-flop with a secondary supply voltage. The method includes interrupting the primary supply voltage responsive to receiving a retention control signal at the retention flip-flop and latching an output data value of the flip-flop with the retention latch responsive to receiving the retention control signal.

In one embodiment, an integrated circuit includes a retention flip-flop. The retention flip-flop includes a first latch configured to receive a primary supply voltage and a second latch configured to receive the primary supply voltage. The retention flip-flop includes a retention latch configured to receive a secondary supply voltage and including a first terminal configured to receive a retention control signal to activate the retention latch and a clock generation circuit configured to generate a clock signal and including a second terminal configured to receive the retention control signal.

In one embodiment, a method includes operating a retention flip-flop in a standard mode including supplying a primary supply voltage to a first latch and a second latch of the retention flip-flop supplying a secondary supply voltage to a retention latch of the retention flip-flop and generating a clock signal. In one embodiment, the method includes transitioning the retention flip-flop from the standard mode to a retention mode responsive to receiving a retention control signal. The retention mode includes interrupting generation of the clock signal responsive to receiving the retention control signal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
powering a first latch and a second latch of a retention flip-flop with a primary supply voltage;
powering a retention latch of the flip-flop with a secondary supply voltage;
interrupting the primary supply voltage responsive to receiving a retention control signal at the retention flip-flop; and
latching an output data value of the flip-flop with the retention latch responsive to receiving the retention control signal.

2. The method of claim 1, comprising interrupting a clock signal of the flip-flop responsive to receiving the retention control signal.

3. The method of claim 2, comprising interrupting operation of the first latch responsive to receiving the retention control signal.

4. The method of claim 3, wherein the first latch includes a tristate inverter receiving the clock signal as a control signal.

5. The method of claim 4, wherein interrupting operation of the first latch includes interrupting the control signal by interrupting the clock signal responsive to receiving the retention control signal.

6. The method of claim 3, comprising:
reactivating the primary supply voltage while the retention control signal is present; and
activating an inverter coupled between an output of the balloon latch and an input of the first latch responsive to reactivating the primary supply voltage while the retention control signal is present.

7. The method of claim 6, comprising passing the output data value from the output of the balloon latch to the output of the first latch via the inverter after reactivating the primary supply voltage and while the clock signal is interrupted.

8. The method of claim 7, comprising reactivating the clock signal by removing the retention control signal.

9. An integrated circuit, comprising a retention flip-flop, the retention flip-flop including:
a first latch configured to receive a primary supply voltage;
a second latch configured to receive the primary supply voltage;
a retention latch configured to receive a secondary supply voltage and including a first terminal configured to receive a retention control signal to activate the retention latch; and
a clock generation circuit configured to generate a clock signal and including a second terminal configured to receive the retention control signal.

10. The integrated circuit of claim 9, wherein the clock generation circuit is configured to interrupt generation of the clock signal responsive to receiving the retention control signal.

11. The integrated circuit of claim 9, wherein the retention control signal causes the retention flip-flop to transition from a standard mode to a retention mode.

12. The integrated circuit of claim 11, wherein supply of the primary supply voltage to the first and second latches is interrupted responsive to the retention control signal.

13. The integrated circuit of claim 11, wherein the retention flip-flop includes a tristate inverter coupled between an output of the retention latch and an input of the first latch.

14. The integrated circuit of claim 13, wherein the tristate inverter includes a third terminal configured to receive the retention control signal.

15. The integrated circuit of claim 12, wherein the retention flip-flop includes a pass gate coupled between the first latch and the second latch, wherein the pass gate is configured to pass a signal from the first latch to the second latch while the retention control signal is present at the second terminal.

16. The integrated circuit of claim 12, wherein the first latch includes a tristate inverter configured to receive the clock signal as a control signal.

17. A method, comprising:
operating a retention flip-flop in a standard mode including:
supplying a primary supply voltage to a first latch and a second latch of the retention flip-flop;
supplying a secondary supply voltage to a retention latch of the retention flip-flop; and
generating a clock signal; and
transitioning the retention flip-flop from the standard mode to a retention mode responsive to receiving a retention control signal, the retention mode including interrupting generation of the clock signal responsive to receiving the retention control signal.

18. The method of claim 17, wherein the retention mode includes:
interrupting the primary supply voltage responsive to the retention control signal at least during a first phase of the retention mode; and
activating the retention flip-flop responsive to receiving the retention control signal.

19. The method of claim 18, comprising resuming supply of the primary supply voltage during a second phase of the retention mode.

20. The method of claim 19, comprising activating a tristate inverter coupled between an output of the retention latch and an input of the first latch during the second phase of the retention mode.

* * * * *